United States Patent
Jun

(10) Patent No.: US 7,884,435 B2
(45) Date of Patent: Feb. 8, 2011

(54) PATTERN MASK FOR FORMING MICROLENS, IMAGE SENSOR AND FABRICATING METHOD THEREOF

(75) Inventor: Sung Ho Jun, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 488 days.

(21) Appl. No.: 11/986,916

(22) Filed: Nov. 26, 2007

(65) Prior Publication Data
US 2008/0137207 A1 Jun. 12, 2008

(30) Foreign Application Priority Data
Dec. 11, 2006 (KR) ................... 10-2006-0125279

(51) Int. Cl.
*H01L 31/0232* (2006.01)
(52) U.S. Cl. ............... 257/432; 257/440; 257/443; 257/E27.134; 348/274
(58) Field of Classification Search ........... 257/431, 257/432, 440, 443; 362/331, 335, 361; 348/273, 348/274, 275, 277, 280
See application file for complete search history.

(56) References Cited

U.S. PATENT DOCUMENTS

| | | | | |
|---|---|---|---|---|
| 4,721,999 | A * | 1/1988 | Takemura et al. | 348/276 |
| 5,238,856 | A * | 8/1993 | Tokumitsu | 438/69 |
| 6,734,031 | B2 * | 5/2004 | Shizukuishi | 438/22 |
| 7,199,931 | B2 * | 4/2007 | Boettiger et al. | 359/619 |
| 7,227,692 | B2 * | 6/2007 | Li et al. | 359/619 |
| 7,307,788 | B2 * | 12/2007 | Boettiger et al. | 359/619 |
| 7,375,892 | B2 * | 5/2008 | Boettiger et al. | 359/619 |
| 7,476,562 | B2 * | 1/2009 | Boettiger et al. | 438/57 |
| 2003/0215967 | A1 * | 11/2003 | Shizukuishi | 438/22 |
| 2005/0078377 | A1 * | 4/2005 | Li et al. | 359/619 |
| 2005/0128596 | A1 * | 6/2005 | Li et al. | 359/619 |
| 2005/0280012 | A1 * | 12/2005 | Boettiger et al. | 257/88 |
| 2005/0281942 | A1 | 12/2005 | Park et al. | |
| 2006/0023312 | A1 * | 2/2006 | Boettiger et al. | 359/619 |
| 2006/0027887 | A1 * | 2/2006 | Boettiger et al. | 257/432 |
| 2006/0054786 | A1 * | 3/2006 | Galambos et al. | 250/208.1 |
| 2006/0119950 | A1 * | 6/2006 | Boettiger et al. | 359/626 |
| 2006/0131683 | A1 * | 6/2006 | Wake | 257/432 |
| 2006/0131767 | A1 * | 6/2006 | Wake | 264/1.32 |

(Continued)

FOREIGN PATENT DOCUMENTS

KR  10-2005-0120404  12/2005

(Continued)

OTHER PUBLICATIONS

Korean Office Action dated Oct. 30, 2007; Korean Patent Application No. 10-2006-0125279; 4 pgs.; Korean Intellectual Property Office, Republic of Korea.

(Continued)

*Primary Examiner*—David Vu
*Assistant Examiner*—Earl N Taylor
(74) *Attorney, Agent, or Firm*—The Law Offices of Andrew D. Fortney; Andrew D. Fortney

(57) ABSTRACT

A pattern mask for forming a microlens includes mask pattern parts alternately arranged and corresponding to pixel regions in a matrix, wherein neighboring corners of the mask pattern parts overlap with each other.

20 Claims, 8 Drawing Sheets

U.S. PATENT DOCUMENTS

2006/0289912 A1* 12/2006 Sik .............................. 257/292
2007/0102621 A1* 5/2007 Kim ......................... 250/208.1
2007/0102716 A1* 5/2007 Kim ............................. 257/89

FOREIGN PATENT DOCUMENTS

WO    WO 2006/060298 A2    6/2006

OTHER PUBLICATIONS

Nam Soo Kim and Jeong Lyeol Park; Method for Forming Microlens in Image Sensor to Remarkably Improve Performance of Image Sensor; Korean Patent Abstracts; Publication No. 1020050120404 A; Published Dec. 22, 2005; Korean Intellectual Property Office, Korea.

* cited by examiner

PATTERN MASK FOR FORMING MICROLENS, IMAGE SENSOR AND FABRICATING METHOD THEREOF

The present application claims priority under 35 U.S.C. 119 and 35 U.S.C. 365 to Korean Patent Application No. 10-2006-0125279 (filed on Dec. 11, 2006), which is hereby incorporated by reference in its entirety.

BACKGROUND

Embodiments of the invention relate to a pattern mask for forming a microlens, an image sensor, and a fabricating method thereof.

An image sensor is a semiconductor device that converts an optical image into an electrical signal. Representative image sensors in the related art include charge coupled devices and CMOS image sensors.

The image sensor may be fabricated by the following process.

First, transistors and photodiodes electrically connected to the transistors are formed on a semiconductor substrate, and an insulating layer structure and a wiring layer are formed on the transistors and photodiodes. Then, red, green, and blue color filters are formed on the insulating layer structure, and a positive type of photoresist film is coated on the upper surface of the color filter to form a planarization layer. Thereafter, the photoresist film is coated on the upper surface of the planarization layer and the photoresist film is patterned by an exposure process and a developing process to form a microlens.

FIG. 1 is a plan view showing a pattern mask for patterning a photoresist film in order to form a microlens in the related art.

Referring to FIG. 1, the pattern mask 1 in the related art comprises a mask body 2 and an aperture 3. In the embodiment, the aperture 3 is formed at a position where a microlens will be formed.

FIG. 2 is a plan view showing a microlens patterned using the pattern mask of FIG. 1.

Referring to FIG. 2, when forming microlenses 4 by exposing and developing a photoresist film using a pattern mask 1 of FIG. 1, the corner portions of the microlenses 4 are rounded due to various causes. When the corner portions of the microlenses 4 are rounded, the space between the corner portions of the four microlenses 4 has a large gap 5 if the microlenses 4 are arranged in a matrix form, wherein any light passing through the gap 5 that is incident on a photodiode may considerably reduce image quality.

Also, a gap 6 is generally formed between two neighboring microlenses 4 in the example of FIG. 2. At this time, the width of the gap 4 formed between the microlenses 4 may be about 100 nm to about 200 nm, wherein light incident through the gap 4 may also reduce image quality.

SUMMARY

Embodiments of the invention provide a pattern mask for forming microlenses for improving image quality by reducing a gap between the microlenses.

Other embodiments of the invention provide an image sensor fabricated using the pattern mask for forming the microlens and a fabricating method thereof.

A pattern mask for forming a microlens according to embodiments of the invention comprises mask pattern parts alternately arranged corresponding to pixel regions in a matrix form, wherein adjacent alternately arranged mask pattern parts have neighboring corners that overlap with each other.

An image sensor according to an embodiment comprises: photodiodes on a semiconductor substrate; color filters arranged on or over the photodiodes in a matrix form; and first microlenses and second microlenses alternately arranged on or over the color filters, wherein neighboring corners of the first microlenses connect to each other and the second microlenses overlap with edges of the first microlenses. In one example, the neighboring corners of the second microlenses also connect to each other.

A method of fabricating an image sensor according to embodiments of the invention comprises the steps of: forming photodiodes on a semiconductor substrate; forming color filters on or over the photodiodes; forming first microlenses having corner portions connected to each other on or over some of the color filters; and forming second microlenses overlapping with edges of the first microlenses on or over remaining color filters on which the first microlenses are not formed. In one example, the second microlenses also have neighboring corner portions connected to each other.

DETAILED DESCRIPTION OF THE EMBODIMENTS

Hereinafter, a pattern mask for forming microlenses, an image sensor, and a method of fabricating an image sensor according to embodiments of the invention will be described in detail with reference to the accompanying drawings.

Figure 1:
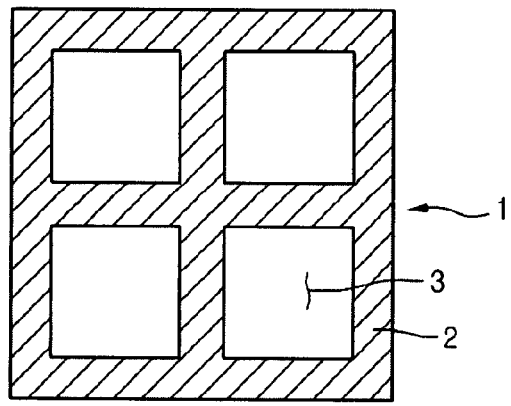
FIG. 1 is a plan view showing a pattern mask for patterning a photoresist film for forming microlenses in the related art.
Figure 2:
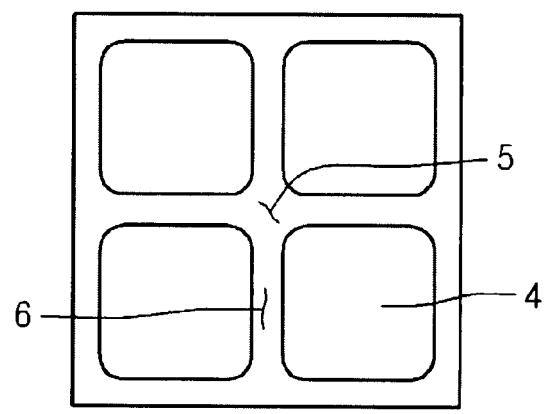
FIG. 2 is a plan view showing a microlens patterned using the pattern mask of FIG. 1.
Figure 3:
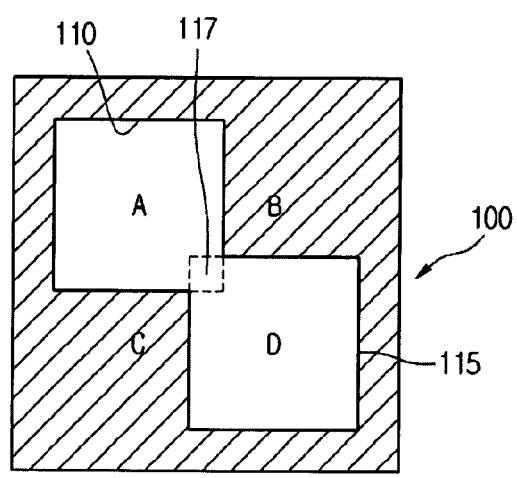
FIG. 3 is a plan view showing a pattern mask for forming a microlens according to one embodiment.

FIG. 3 is a plan view showing a pattern mask for forming microlenses according to embodiments of the invention.

Referring to FIG. 3, a pattern mask 100 for forming microlenses comprises mask pattern parts 110 and 115 that are aligned with pixel regions A, B, C, and D, which are arranged in a matrix form. Although each pixel region A, B, C, and D is not shown, in a plan view, they each have a quadrangular shape (e.g., square or rectangular). Thus, the pixel regions (and thus, the color filters and/or the microlenses) of the present image sensor may be arranged in an x-by-y matrix of quadrangles, where x refers to a plurality of rows and y refers to a plurality of columns. In various embodiments, x and y are independently an integer of at least 2, 3, 5, 8, 16 or more.

In embodiments of the invention, the mask pattern parts 110 and 115 are alternately formed in the pixel regions A and D. In other words, the mask pattern parts 110 and 115 are formed in the pixel regions not adjacent to each other along a side or border of the pixel regions A, B, C, and D. Rather, in FIG. 3, the mask pattern parts 110 and 115 in the pixel regions A and D are adjacent to each other in a diagonal direction (e.g., at neighboring corners).

In various embodiments of the invention, the mask pattern parts 110 and 115 overlap in region 117 by the overlapping of neighboring (e.g., adjacent) corners. In certain embodiments of the invention, the corners of the mask pattern parts 110 and 115 overlap with each other by about 100 nm to 200 nm (either along a border of the quadrangle, or along the diagonal axis between the centers of the quadrangles).

Also, in embodiments of the invention, the mask pattern parts 110 and 115 may be light transmitting parts that transmit light or light blocking parts that block light, according to a kind or type of a photoresist layer used.

Figure 4:
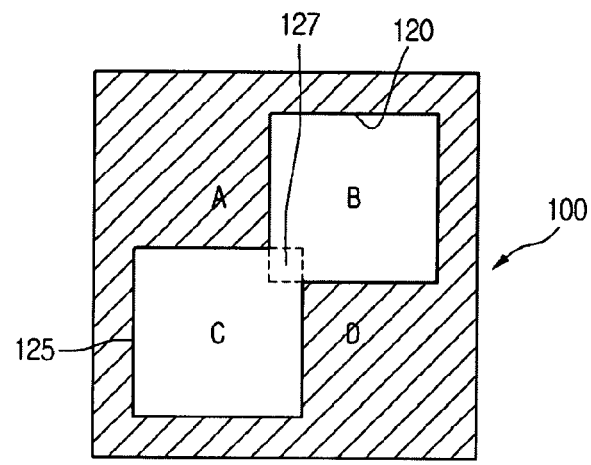
FIG. 4 is a plan view showing a pattern mask according to another embodiment.

FIG. 4 is a plan view showing a second pattern mask according to the exemplary embodiment.

Referring to FIG. 4, the pattern mask 100 for forming the microlenses may comprise mask pattern parts 120 and 125 aligned with the pixel regions B and C in a matrix form. In various embodiments of the invention, although each pixel region A, B, C and D is not shown, when viewing through a plan view, they have a quadrangular shape.

In embodiments of the invention, the mask pattern parts 120 and 125 are alternately formed in the pixel regions B and C. In other words, the mask pattern parts 120 and 125 are formed in pixel regions not adjacent to each other along a side or linear border of the pixel regions A, B, C, and D. Rather, in FIG. 4, the mask pattern parts 120 and 125 are formed in pixel regions B and C adjacent to each other in a diagonal direction (e.g., at neighboring corners).

Thus, in embodiments of the invention, the mask pattern parts 120 and 125 may overlap in area 127 formed by the overlapping of their neighboring (e.g., adjacent) corners. In certain embodiments of the invention, the corners of the mask pattern parts 120 and 125 overlap with each other by about 100 nm to 200 nm, either along a border of the quadrangle, or along the diagonal axis between the centers of the quadrangles.

Also, in embodiments of the invention, the mask pattern parts 120 and 125 may be light transmitting parts that transmit light or light blocking parts that block light, according to the kind of a photoresist layer used. In a further embodiment, mask pattern parts 120 and 125 may be on different masks (e.g., when mask pattern part 120 corresponds to one color filter [for example, a blue color filter], it is on a second mask, and mask pattern part 125, corresponding to a different color filter [for example, a red color filter], is on a third mask).

In embodiments of the invention, all of the pixel regions A, B, C, and D can be provided with microlenses using the pattern masks 100 shown in FIGS. 3 and 4.

Figure 5:
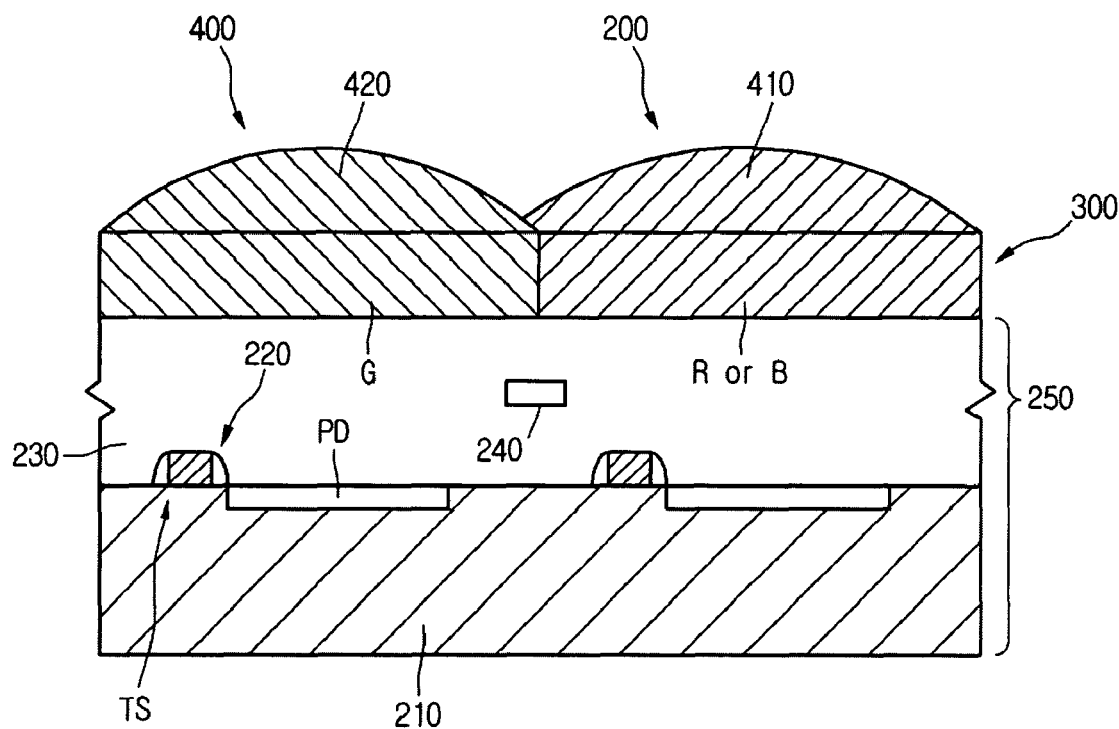
FIG. 5 is a cross-sectional view showing an image sensor according to one embodiment.

FIG. 5 is a cross-sectional view showing an image sensor according to embodiments of the invention. FIG. 6 is a plan view showing the microlenses of FIG. 5.

Referring to FIG. 5, an exemplary image sensor 200 may comprise a photodiode structure 250, color filters 300, and microlenses 400 on a semiconductor substrate 210. The photodiode structure 250 comprises unit pixels 220 and an insulating layer structure 230. The unit pixels 220 are formed on the semiconductor substrate in plural. FIG. 5 illustratively shows two pixels 220. Each unit pixel 220 comprises a photodiode (PD) and a transistor structure (TS). In various embodiments of the invention, the transistor structure (TS) comprises three to five transistors, wherein the transistor structure (TS) performs a role of outputting image signals generated from electrons in the photodiode (PD), which result from light incident on the photodiode PD.

The insulating layer structure 230 covers the unit pixels 220 on the semiconductor substrate 210. A wiring structure 240 for driving signals in the unit pixels 220 can be arranged within the insulating structure 230. In a preferred embodiment, wiring structure 240 also provides a light-blocking function to reduce the probability that light passing through a microlens for one pixel (e.g., microlens 420) does not reach the photodiode of an adjacent pixel (e.g., the photodiode labeled "PD").

The color filter layer 300 generally comprises a plurality of color filters of different colors (e.g., a red color filter (R), a green color filter (G), and a blue color filter (B)). Typically, each color filter in the color filter layer 300 is formed at a position corresponding to each pixel 220 shown in FIG. 5.

Figure 6A:
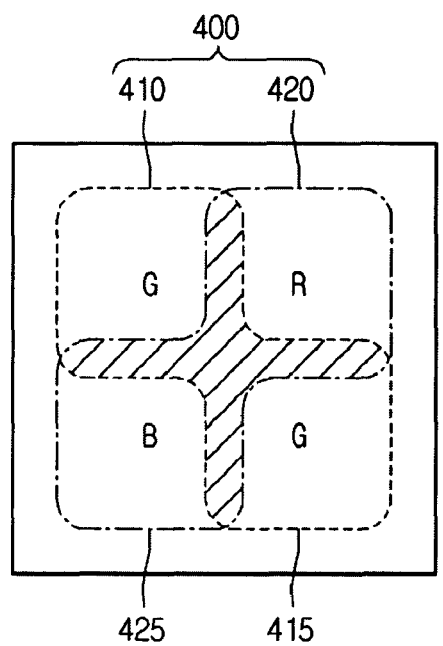
FIGS. 6A-B are plan views showing exemplary microlenses of FIG. 5.
Figure 6B:
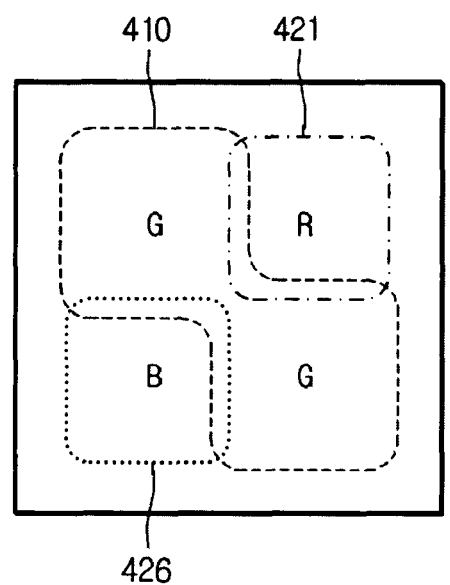

Referring to FIGS. 6A-B, each of the green color filter (G), the red color filter (R), and the blue color filter (B) is arranged on the insulating layer structure 230 in a matrix form. For example, the green color filters (G) are alternately arranged on the insulating film structure 230 so that they are not adjacent to each other along a row or column of the matrix.

Specifically, the green color filters (G) are arranged in a diagonal direction. The red color filter (R) and the blue color filter (B) are arranged to be adjacent to the green color filters (G), and the red color filter (R) and the blue color filter (B) are arranged in a diagonal direction.

Referring to FIGS. 5 and 6A-B, the microlenses 400 are formed on the color filter layer 300. The microlenses 400 comprise first microlenses 410 and 415 and second microlenses 420 and 425.

In embodiments of the invention, the first microlenses 410 and 415 are on, for example, the green color filters (G). In one embodiment, the green color filters (G) may be arranged in one or more diagonal directions among the color filters in color filter layer 300. In addition, the second microlenses 420 and 425 are on the red color filter (R) and the blue color filter (B), respectively. In another embodiment, the red color filter (R) and the blue color filter (B) may also be arranged in a diagonal direction among the color filters in color filter layer 300.

In embodiments of the invention, the corners of the first microlenses 410 and 415 on the green color filters (G) are connected to each other. Also, the corners of the second microlenses 420 and 425 arranged on the blue color filter (B) and the red color filter (R) arranged in a diagonal direction may be connected to each other, as shown in FIG. 6A.

Meanwhile, as shown in FIG. 5, a portion of an edge (preferably a portion of each side edge or border) of the second microlenses 420 and 425 overlaps with the first microlenses 410 and 415 so that a gap does not exist between the first microlenses 410 and 415 and the second microlenses 420 and 425.

Referring now to FIG. 6B, the corners of the microlens 420 on the blue color filter (B) and the microlens 425 on the red color filter (R) are not necessarily required to be connected to each other in the diagonal direction. As long as the edges, sides or borders of the second microlenses 420 and 425 overlap the edges, sides or borders of the first microlenses 410 and 415, then there is effectively a zero gap between the microlenses.

In embodiments of the invention, the first microlenses 410 and 415 have a first thickness and the second microlenses 420 and 425 have a second thickness different from (e.g., less than) the first thickness. In various embodiments, the thickness of the first microlenses 410 and 415 may be from about 1.0 μm to about 2.0 μm, and the thickness of the second microlenses 420 and 425 may be from about 0.7 μm to about 1.6 μm. In other embodiments, the first thickness of the first microlenses 410 and 415 is about 0.36 μm to about 0.44 μm greater in thickness than the second thickness of the second microlenses 420 and 425. In one implementation, the thickness of the first microlenses 410 and 415 is about 1.7 μm, and the thickness of the second microlenses 420 and 425 is about 1.3 μm.

FIGS. 7 to 15 are cross-sectional views and plan views showing a method of fabricating an image sensor according to embodiments of the invention.

Figure 7:
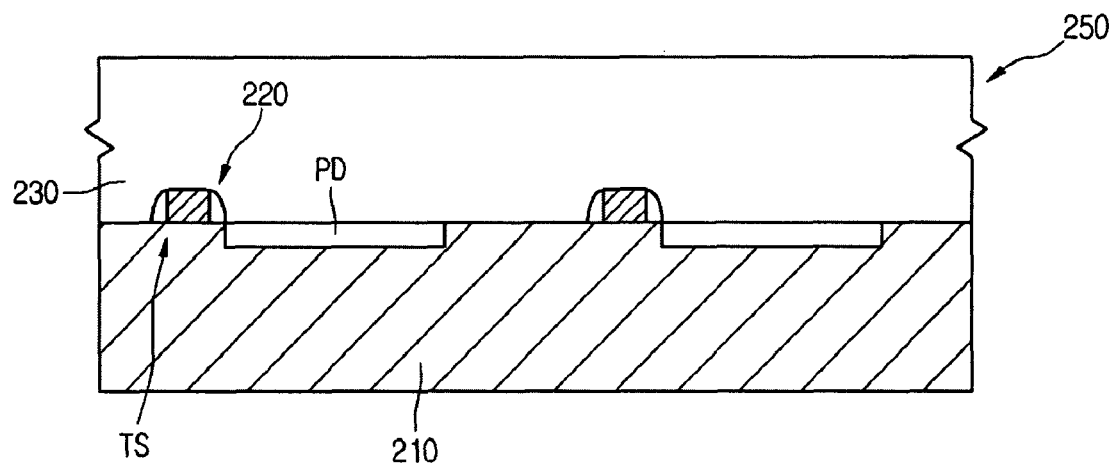
FIGS. 7 to 15 are cross-sectional views and plan views showing a method of fabricating an image sensor according to one embodiment.

Referring to FIG. 7, the photodiode structure 250 is formed on the semiconductor substrate 210. In order to form the photodiode structure 250, the transistor structure (TS) comprising three to five transistors and the photodiodes (PD) are formed on the semiconductor substrate 210.

After the pixels 220 are formed on the semiconductor substrate 210, the insulating layer structure 230 is formed on the semiconductor substrate 210. The insulating structure 230 performs a role of covering and insulating the pixels 220. During forming the insulating layer structure 230, a wiring structure (240 in FIG. 5, but not shown in FIGS. 7-13) for driving signals in the unit pixels 220 can be formed in or on the insulating layer structure 230.

Figure 8:
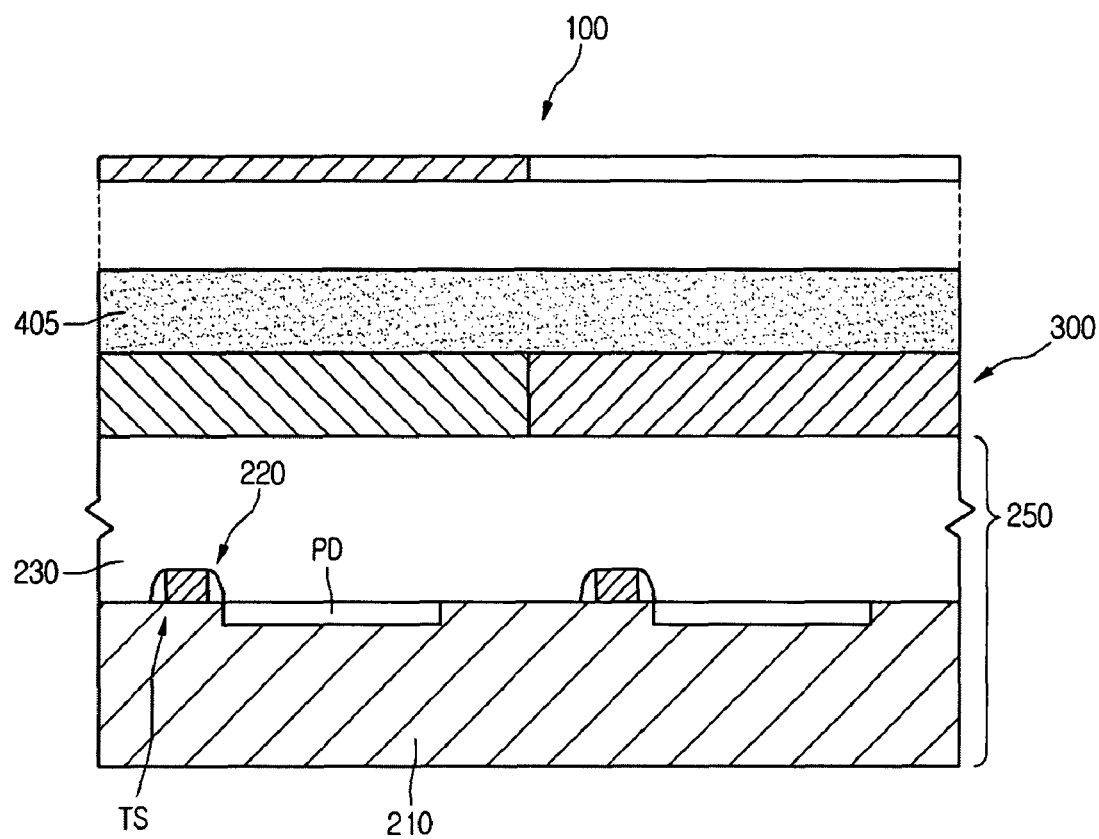

Referring to FIG. 8, after the photodiode structure 250 is formed, the color filters 300 are formed on the insulating layer structure 230. The color filters 300 are each formed at a position corresponding to a photodiode (PD) in a corresponding pixel 220. The color filter layer 300 may comprise a red color filter (R), a blue color filter (B), and a green color filter (G). Alternatively, color filter layer 300 may comprise a yellow color filter, a cyan color filter, and a magenta color filter (a so-called "YCM" system).

In order to form the color filters 300, the green color filters (G) are formed over certain unit pixels 220 in the matrix so that they are not immediately adjacent to each other. After the green color filters (G) are formed, the red color filters (R) and the blue color filters (B) are formed in the matrix, alternating over every other pixel 220, so as not to be adjacent to each other. In other words, the red color filter (R) and the blue color filter (B) are alternately arranged, the red color filter (R) and the blue color filter (B) are also arranged in a diagonal direction, and the red color filter (R) and the blue color filter (B) are adjacently arranged to the green color filter (G).

Thereafter, a photoresist layer 405 is formed over the color filters 300 and as shown in FIG. 3, the first pattern mask 100 arranged or over the photoresist layer 405 and having the first mask pattern parts 110 and 115 whose corners are connected to each other is aligned with locations for the green color filter (G) over the corresponding unit pixels in the matrix (or array) of pixels.

Figure 9:
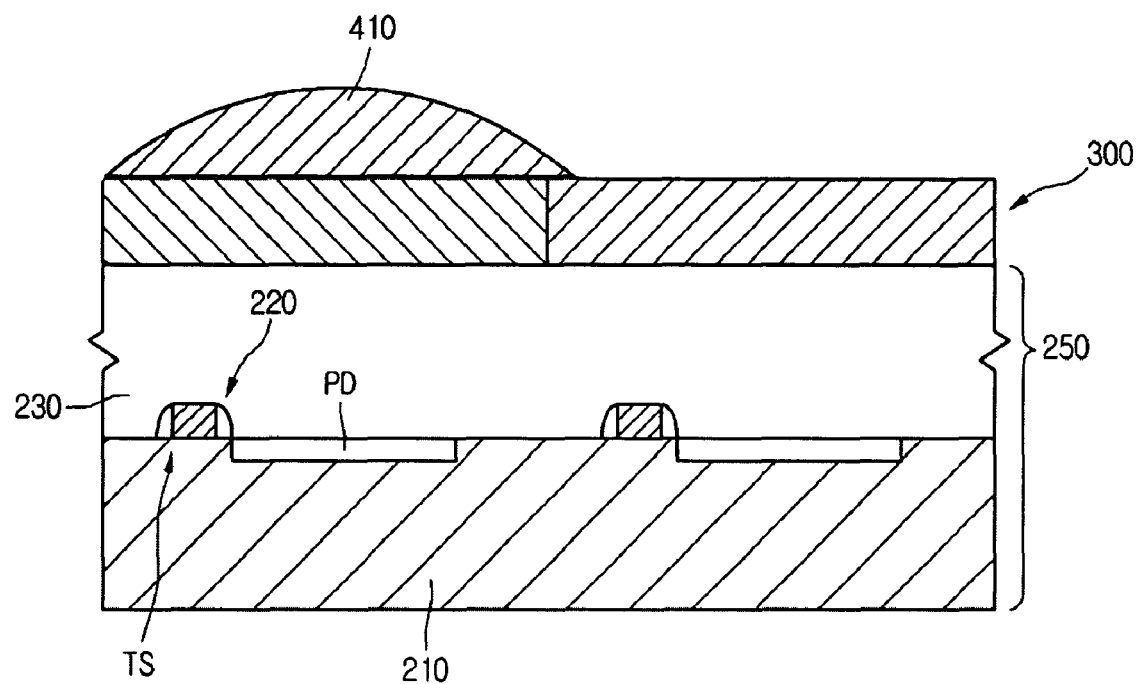
Figure 10A:
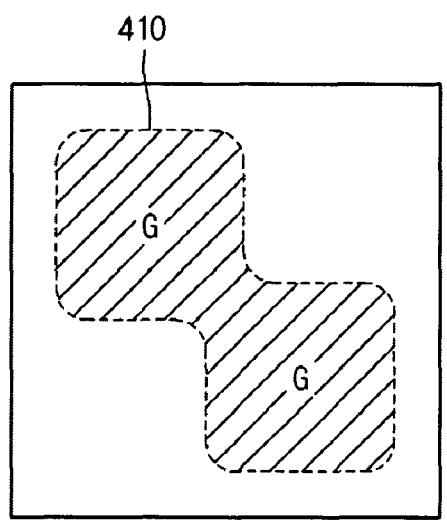
Figure 10B:
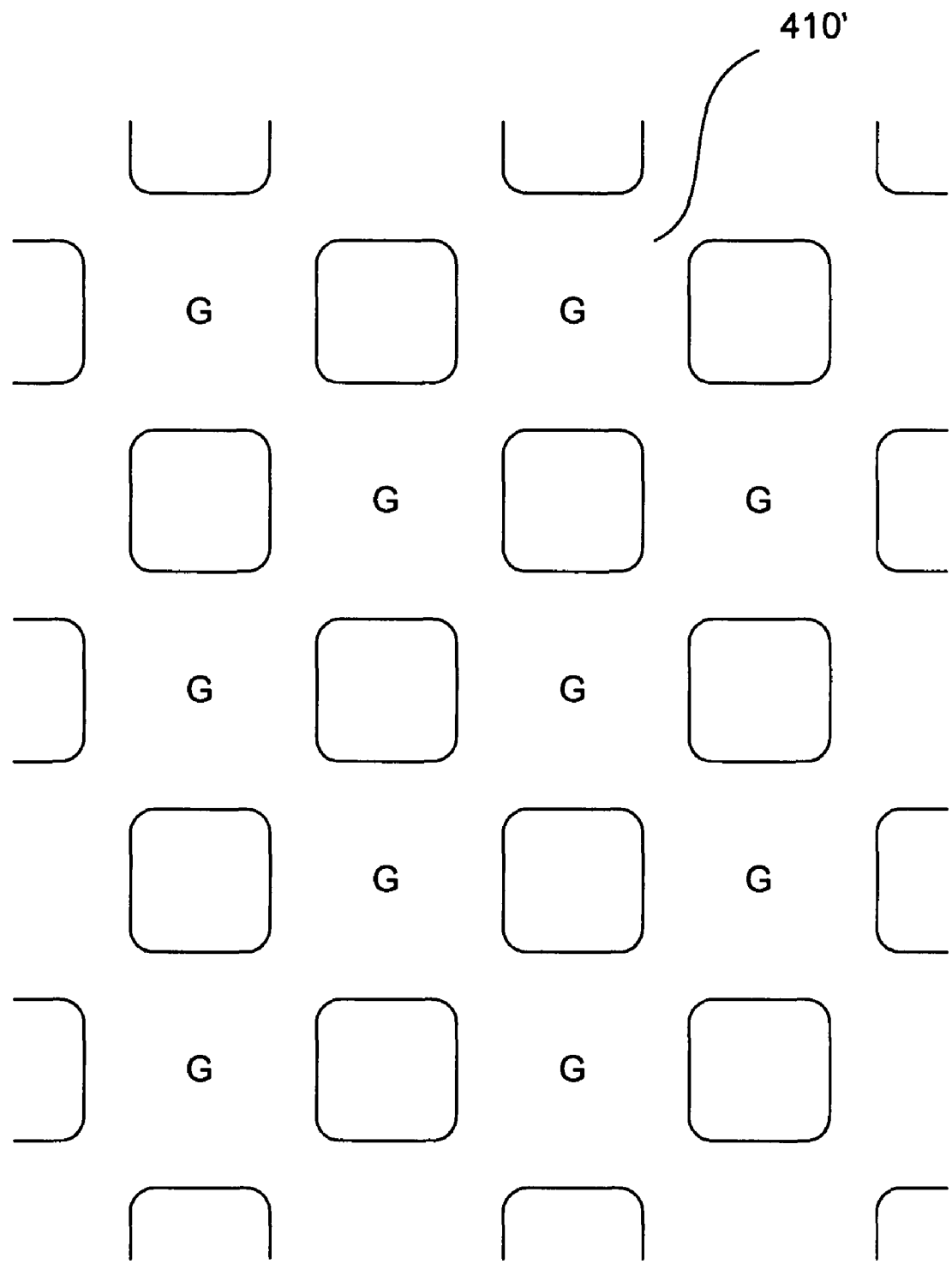

Thereafter, the photoresist layer 405 is exposed and developed by means of the light provided through the first mask pattern parts 110 and 115 of the first pattern mask 100 to form first microlens precursors (not shown) on the color filters 300. The first microlens precursors are reflowed by means of thermal energy (e.g., heating to a temperature of less than 250° C., preferably from about 150° C. to about 200° C.) to form the first microlens 410 on the green color filter (G) as shown in FIG. 9. The first microlenses 410 cover the green color filters (G) and have a shape where the corner portions of the green color filters (G) are connected, as shown in FIG. 10A. FIG. 10B shows an expanded view of the mask pattern 410' for forming microlenses 410 over the green color filters (G) in the color filter/unit pixel matrix.

Figure 11:
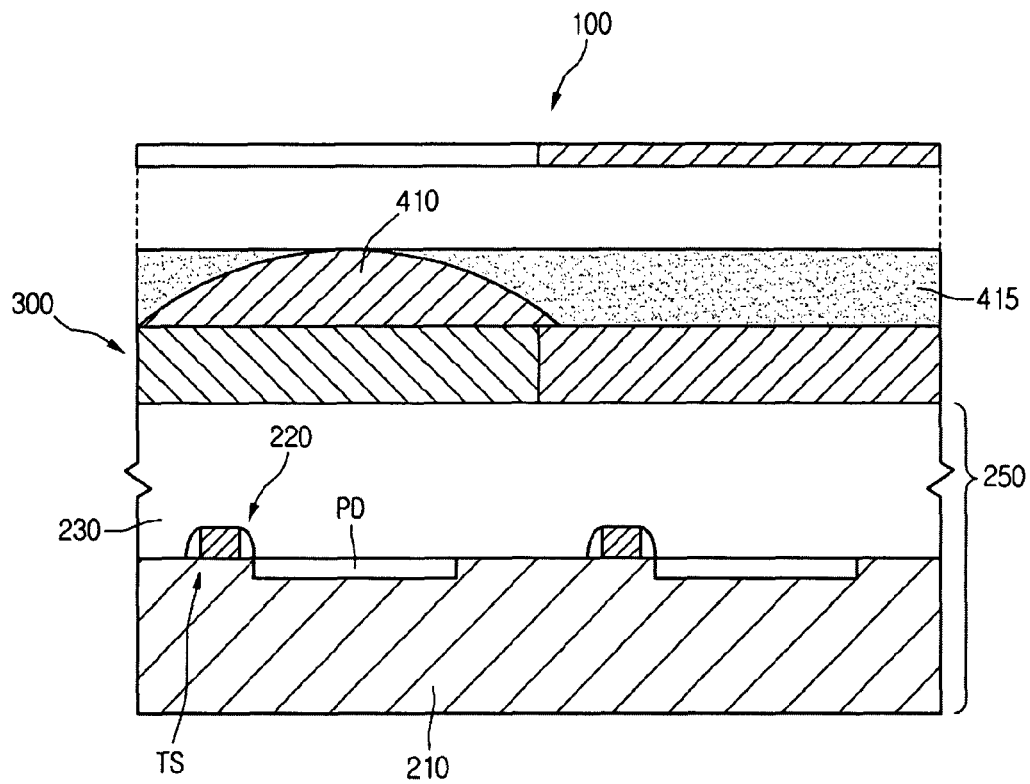

Referring to FIG. 11, a photoresist layer 415 is formed on or over the color filters 300 and the first microlenses 410. As shown in FIG. 4, the second pattern mask 100 arranged on or over the photoresist layer 405 and having at least one of the second mask pattern parts 120 and 125 is aligned to locations over the unit pixels in the matrix (or array) corresponding to the red color filter (R) and/or the blue color filter (B), depending on the mask pattern part(s) present on the second pattern mask 100.

Figure 12A:
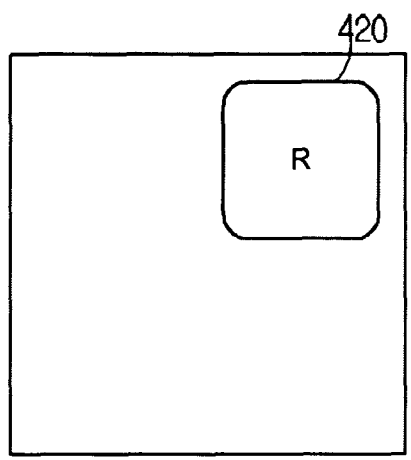
Figure 12B:
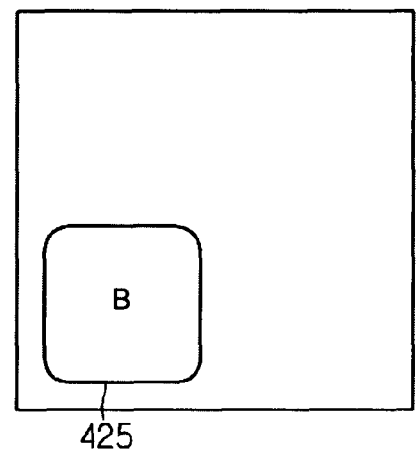
Figure 13A:
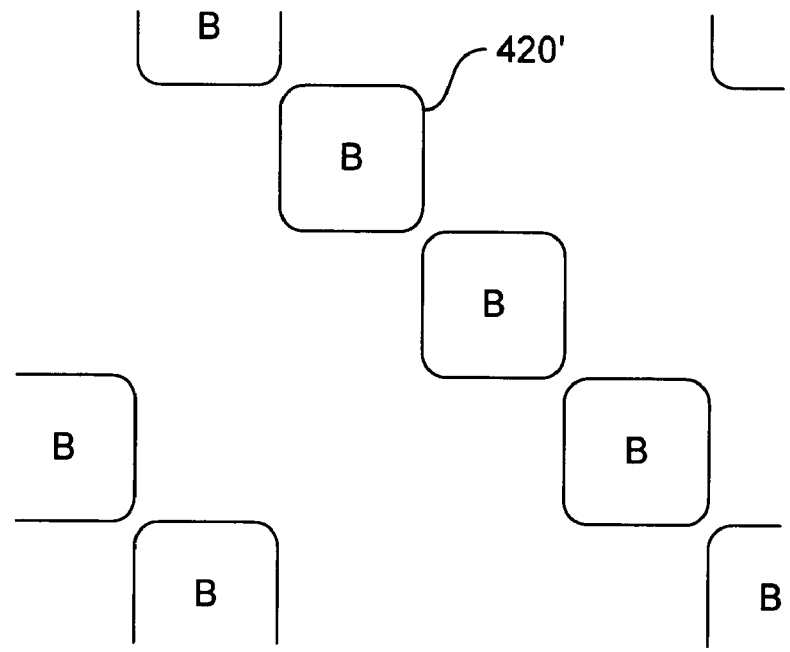
Figure 13B:
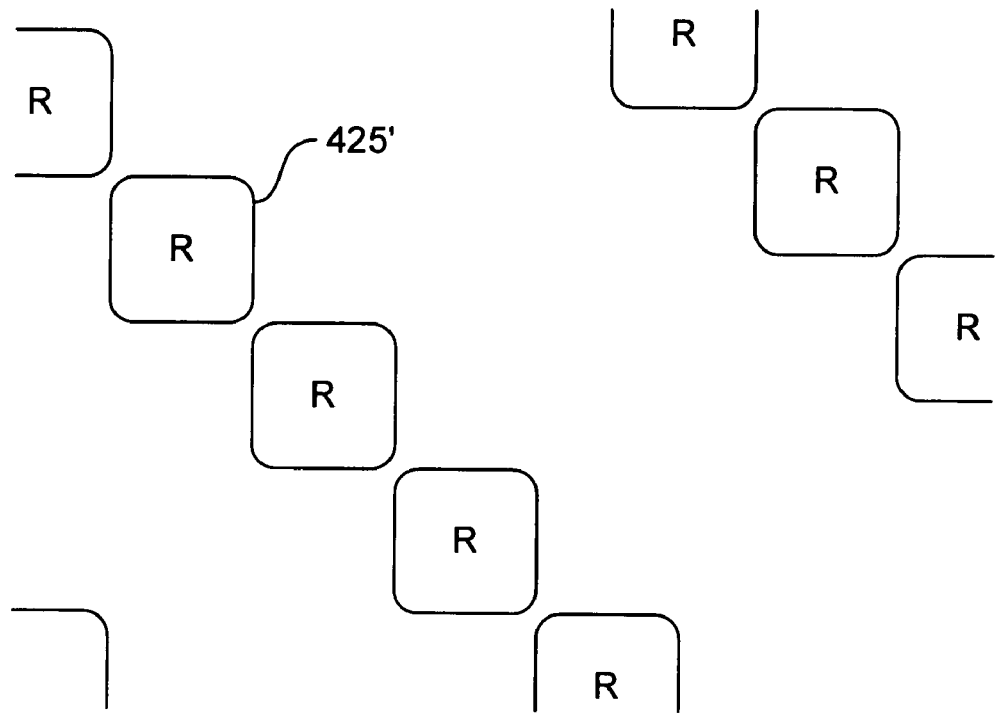

Thereafter, the photoresist layer 415 is exposed and developed by means of the light provided through the second mask pattern part(s) 120 and/or 125 of the second pattern mask 100 to form a second microlens precursor (not shown) on the red and/or blue color filter, and the second microlens precursor is reflowed by means of thermal energy (e.g., heat) to form the second microlens 420 on the red color filter (R) and/or blue color filter (B) as shown in FIG. 12. Naturally, if microlenses 420 are formed over only the red color filters (R; see the corresponding mask pattern in FIG. 12A) or the blue color filters (B; see the corresponding mask pattern in FIG. 12B), a third mask pattern having the mask pattern part not in the second mask pattern may be used. Also, as shown in FIGS. 13A-B, the second and/or third mask pattern parts (B in FIG. 13A, R in FIG. 13B) may have an area that is slightly smaller than a corresponding area of the first mask pattern part (e.g., 110 or 115 in FIG. 3), such that neighboring corners of the microlenses 420 over the red color filters (R) do not necessarily contact the microlenses 420 over the blue color filters (B), but the edges, sides and/or borders of the microlenses 420 over the red color filters (R) and the blue color filters (B) overlap with the edges, sides and/or borders of the microlenses 410 over the green color filters (G).

In a further alternative, the first mask pattern may be used to form either red or blue color filters, and the second (and when used, third) mask pattern(s) may be used to form remaining color filters. In an even further alternative, the second (and when used, third) mask pattern(s) may contain mask pattern parts in alternating locations along a single row and/or column of the matrix, and when second and third mask patterns are used, the corresponding mask pattern parts may be in alternate rows and/or columns.

Figure 14:
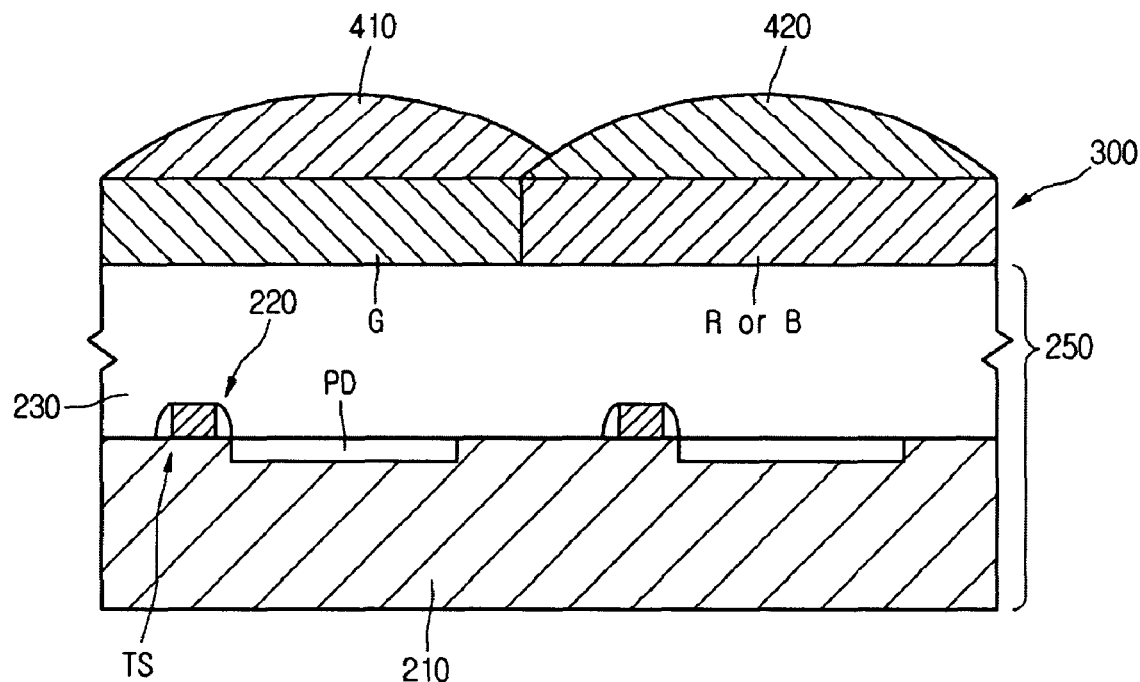
Figure 15:
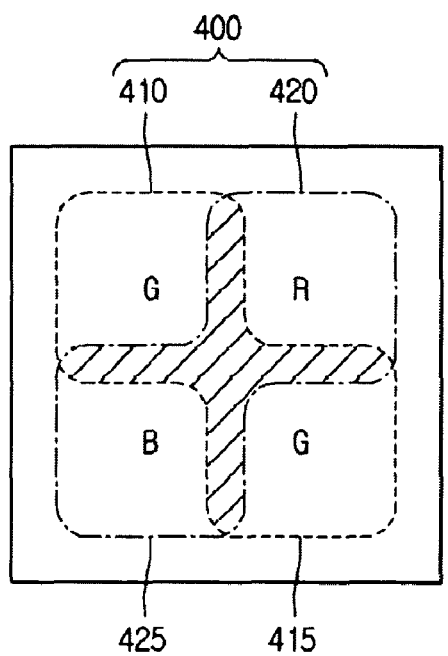

In the embodiment of FIG. 14, the second microlens 420 covers the red color filter (R) and/or the blue color filter (B), and has a shape where the corner portions connect to each other, as shown in FIG. 15, and/or where the edge overlaps with the edge of the first microlens 410, as shown in FIG. 14. Also, the first microlens 410 may have a first thickness, and the second microlens 420 may have a second thickness different from the first thickness.

According to the description as above, the gap between the microlenses is completely removed to improve the image quality generated from the image sensor.

Any reference in this specification to "one embodiment," "an embodiment, example embodiment," etc., means that a particular feature, structure, or characteristic described in connection with Embodiments of the invention is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of Embodiments of the inventions.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a photodiode structure on a semiconductor substrate;
   color filters on the photodiode structure in a matrix; and
   first and second pluralities of microlenses alternately arranged on the color filters, wherein neighboring corners of the first microlenses are connected to each other, neighboring corners of the second microlenses are connected to each other, and the second microlenses overlap with edges of the first microlenses.

2. The image sensor according to claim 1, wherein the first microlenses have a first thickness and the second microlenses have a second thickness.

3. The image sensor according to claim 2, wherein the first thickness of the first microlenses is about 0.36 μm to about 0.44 μm thicker than the second thickness of the second microlenses.

4. The image sensor according to claim 1, wherein the color filters comprise a red color filter transmitting light with a red wavelength, a green color filter transmitting light with a green wavelength, and a blue color filter transmitting light with a blue color filter.

5. The image sensor according to claim 4, wherein the green color filters are alternately arranged, the first microlenses correspond to the green color filters, and the second microlenses correspond to at least one of the red and blue color filters.

6. The image sensor according to claim 5, wherein the second microlenses correspond to one of the red and blue color filters, and the image sensor further comprises third microlenses corresponding to the other of the red and blue color filters.

7. An image sensor comprising:
   a photodiode structure on a semiconductor substrate;
   color filters on the photodiode structure in a matrix, wherein the color filters comprise a red color filter transmitting light with a red wavelength, first and second green color filters transmitting light with a green wavelength, and a blue color filter transmitting light with a blue wavelength, wherein the first and second green color filters are disposed in a first diagonal direction, and the red color filter and the blue color filter are disposed in a second diagonal direction; and
   first and second microlenses on the color filters, wherein the first microlens includes a first portion on the first green color filter and a second portion on the second green color filter, the first portion of the first microlens is connected to the second portion of the first microlens in the first diagonal direction, and the second microlens includes a first portion on the red color filter and a second portion on the blue color filter, wherein the first portion of the second microlens is connected to the second portion of the second microlens in the second diagonal direction.

8. The image sensor according to claim 7, wherein the first diagonal direction is perpendicular to the second diagonal direction.

9. The image sensor according to claim 7, wherein the first microlens overlaps with the second microlens at neighboring corner portions of the red color filter, first and second green color filters, and the blue color filter.

10. The image sensor according to claim 7, wherein the first microlens has a first thickness and the second microlens has a second thickness less than the first thickness.

11. The image sensor according to claim 7, wherein the first microlenses have a first thickness and the second microlenses have a second thickness.

12. The image sensor according to claim 11, wherein the first thickness of the first microlenses is about 0.36 μm to about 0.44 μm thicker than the second thickness of the second microlenses.

13. The image sensor according to claim 1, comprising a plurality of unit pixels, wherein one of said unit pixels comprises said photodiode structure and a transistor structure configured to output an image signal from the photodiode structure, one of said color filters, and a corresponding one of said microlenses; and each of the remainder of said plurality of unit pixels comprises another photodiode structure substantially identical to said photodiode structure, another transistor structure substantially identical to said transistor structure, another one of said color filters, and a corresponding other one of said microlenses.

14. The image sensor according to claim 13, wherein each transistor structure comprises three to five transistors.

15. The image sensor according to claim 1, wherein the photodiode structure further comprises an insulating layer structure and a wiring structure in the insulating layer structure.

16. The image sensor according to claim 15, wherein the wiring structure is configured to provide a light-blocking function.

17. The image sensor according to claim 7, comprising a plurality of unit pixels, wherein one of said unit pixels comprises said photodiode structure, a transistor structure configured to output an image signal from the photodiode structure, one of said color filters, and a corresponding one of said microlenses; and each of the remainder of said plurality of unit pixels comprises another photodiode structure substantially identical to said photodiode structure, another transistor structure substantially identical to said transistor structure, another one of said color filters, and a corresponding other one of said microlenses.

18. The image sensor according to claim 17, wherein the transistor structure comprises three to five transistors.

19. The image sensor according to claim 7, wherein the photodiode structure further comprises an insulating layer structure and a wiring structure in the insulating layer structure.

20. The image sensor according to claim 19, wherein the wiring structure is configured to provide a light-blocking function.

* * * * *